(12) United States Patent
Engelhardt (10) Patent No.: US 8,993,437 B2
(45) Date of Patent: Mar. 31, 2015

(54) METHOD FOR ETCHING SUBSTRATE

(75) Inventor: Manfred Engelhardt, Villach Landskron (AT)

(73) Assignee: Infineon Technologies AG, Neubiberg (DE)

(*) Notice: Subject to any disclaimer, the term of this patent is extended or adjusted under 35 U.S.C. 154(b) by 295 days.

(21) Appl. No.: 13/282,491

(22) Filed: Oct. 27, 2011

(65) Prior Publication Data

US 2013/0109171 A1    May 2, 2013

(51) Int. Cl.
*H01L 21/44*    (2006.01)
*H01L 21/308*    (2006.01)
*H01L 21/78*    (2006.01)

(52) U.S. Cl.
CPC ............ *H01L 21/3086* (2013.01); *H01L 21/78* (2013.01); *H01L 21/3081* (2013.01); *Y10S 438/95* (2013.01)
USPC .............. 438/653; 438/950; 257/E21.584

(58) Field of Classification Search
CPC .......................... H01L 21/784; H01L 21/822
USPC ........ 438/653, 678, 717, 719, 945, 654, 950; 257/E21.232, E21.6, E21.606
See application file for complete search history.

(56) References Cited

U.S. PATENT DOCUMENTS

| | | | |
|---|---|---|---|
| 5,368,711 A * | 11/1994 | Poris ........................... | 204/193 |
| 6,491,835 B1 | 12/2002 | Kumar et al. | |
| 6,919,168 B2 * | 7/2005 | Hwang et al. ............... | 438/653 |
| 7,416,991 B2 * | 8/2008 | Bandic et al. ............... | 438/717 |
| 8,476,166 B2 * | 7/2013 | Kosaka et al. ............... | 438/694 |
| 2003/0141512 A1 * | 7/2003 | Bruderl et al. ............... | 257/99 |
| 2008/0087634 A1 * | 4/2008 | Kohsaka et al. ............. | 216/41 |
| 2009/0296307 A1 * | 12/2009 | Siamak et al. ............... | 361/281 |
| 2010/0103634 A1 * | 4/2010 | Funaya et al. ............... | 361/761 |
| 2010/0119700 A1 * | 5/2010 | Kim ............................. | 427/123 |
| 2012/0153476 A1 * | 6/2012 | Shen ............................ | 257/750 |
| 2013/0206725 A1 * | 8/2013 | Leeser et al. ................ | 216/67 |

FOREIGN PATENT DOCUMENTS

JP     2010141178 A     6/2010

* cited by examiner

*Primary Examiner* — Chandra Chaudhari
(74) *Attorney, Agent, or Firm* — Slater & Matsil, L.L.P.

(57) ABSTRACT

One or more embodiments relate to a method of making a semiconductor structure, comprising: forming a patterned metallic layer over a semiconductor substrate; forming a second layer over the patterned metallic layer; and etching the substrate.

41 Claims, 12 Drawing Sheets

METHOD FOR ETCHING SUBSTRATE

BACKGROUND

One or more embodiments of the present invention relate to semiconductor structures and methods for making semiconductor structures.

BRIEF DESCRIPTION OF THE DRAWINGS

FIGS. 1 through 6A show a process for making a semiconductor structure in accordance with an embodiment;

FIG. 10 through 18A shows a method of making a semiconductor structure in accordance with an embodiment.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
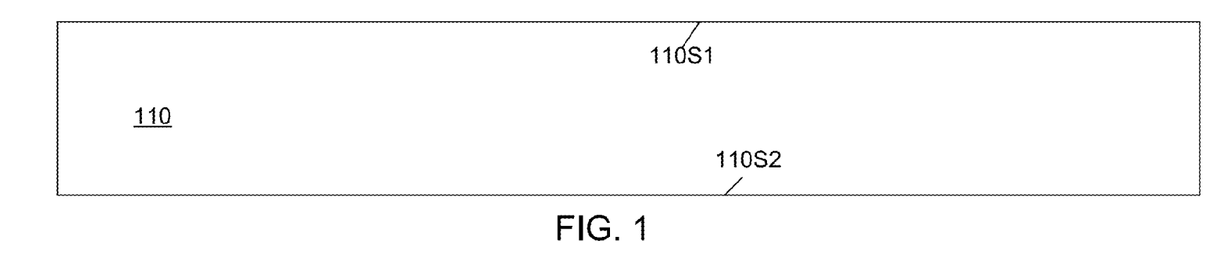

FIG. 1 shows a substrate 110. The substrate 110 may be a semiconductor substrate such as a silicon substrate. The silicon substrate may comprise monocrystalline silicon. The semiconductor substrate may be a bulk semiconductor substrate or a semiconductor-on-insulator substrate. The bulk semiconductor substrate may include an epitaxial layer or may not include an epitaxial layer. The bulk semiconductor substrate may be a bulk silicon substrate. The semiconductor on insulator substrate may be a silicon-on-insulator substrate. In one or more embodiments, the substrate 110 may comprise bulk silicon such as bulk monocrystalline silicon. A silicon-on-insulator substrate may include a bulk silicon substrate, a dielectric layer overlying the bulk silicon substrate and a silicon layer overlying the dielectric layer. The silicon substrate may be a bulk silicon substrate comprising monocrystalline silicon. Hence, in one or more embodiments, the bulk silicon substrate may be a bulk silicon substrate. The bulk silicon substrate may include or may not include an epitaxial layer.

In one or more embodiments, the substrate 110 may include the element Si.

In one or more embodiments, the substrate 110 may be a wafer substrate. Hence, the semiconductor substrate may be a semiconductor wafer substrate such as a silicon wafer substrate. The wafer substrate may be a bulk wafer substrate or a semiconductor on insulator wafer substrate (such as a silicon on insulator wafer substrate.) The substrate 110 may be a silicon wafer substrate. The silicon wafer substrate may comprise monocrystalline silicon such as bulk monocrystalline silicon. The substrate 110 may be a chip substrate.

An example of a bulk silicon substrate is a Czochralski (CZ) silicon wafer substrate. Another type of a bulk silicon substrate is a Flat-Zone (FZ) silicon wafer substrate. The bulk silicon substrate (e.g. bulk silicon wafer substrate) may comprise (or may consist essentially of) bulk silicon such as bulk monocrystalline silicon. The bulk silicon may be p-doped.

In one or more embodiments, the substrate may include any semiconductor material. For example, in one or more embodiments, the substrate 110 may include SiC. In one or more embodiments, the substrate 110 may include GaAs. In one or more embodiments, the substrate 110 may include GaN. Other examples of semiconductor substrates include, but not limited to, silicon carbide substrates (e.g. wafer substrates), GaAs substrates (e.g. wafer substrates) and GaN substrates (e.g. wafer substrates). It is noted that an additional example of a silicon substrate is a SOS (silicon on sapphire) substrate.

The substrate 110 may include a first side 110S1 and a second side 110S2. The second side 110S2 may be opposite the first side 110S1. In some embodiments, the first side 110S1 may correspond to a front side while the second side may correspond to a back side. In some embodiments, the first side 110S1 may correspond to a back side while the second side 110S2 may correspond to a front side. In one or more embodiments, the front side may also correspond to the device side of the substrate. In one or more embodiments, the first side S1 may be the device side of the substrate 110. In one or more embodiments, the second side S2 may be the device side of the substrate S2. In some embodiments, the first side 110S1 and the second side 110S2 may be major sides of the substrate 110.

Figure 2:
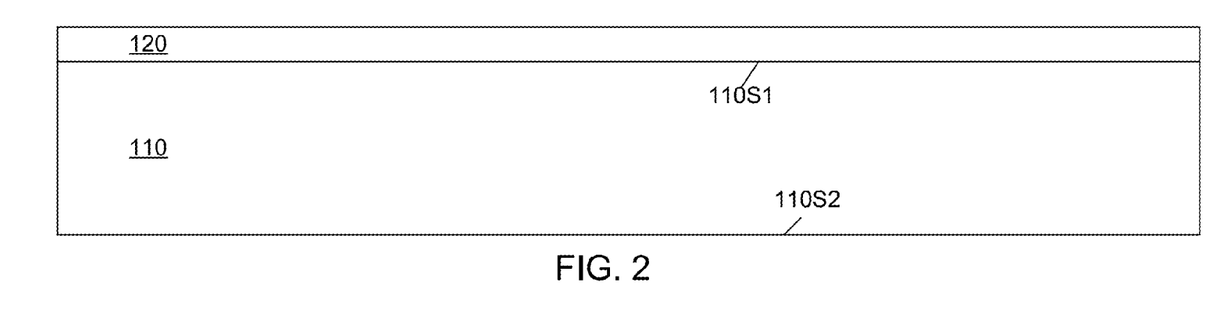

Referring to FIG. 2, a layer 120 may then be formed over the first side 110S1 of the substrate 110. The layer 120 may be a barrier layer such as a diffusion barrier layer. In some embodiments, the layer 120 may comprise a material which may prevent the material of layer 130 from diffusing into the substrate 110. The layer 120 may comprise a metallic material. The metallic material may, for example, include a pure metal, an alloy and/or a compound. It is understood that any pure metal may include some amount of trace impurities. Examples of materials which may be used include metal nitrides such as conductive metal nitrides. Examples of metal nitrides include XN which X is a transition metal element. Examples of materials include TiN, TaN and TW.

Figure 3:
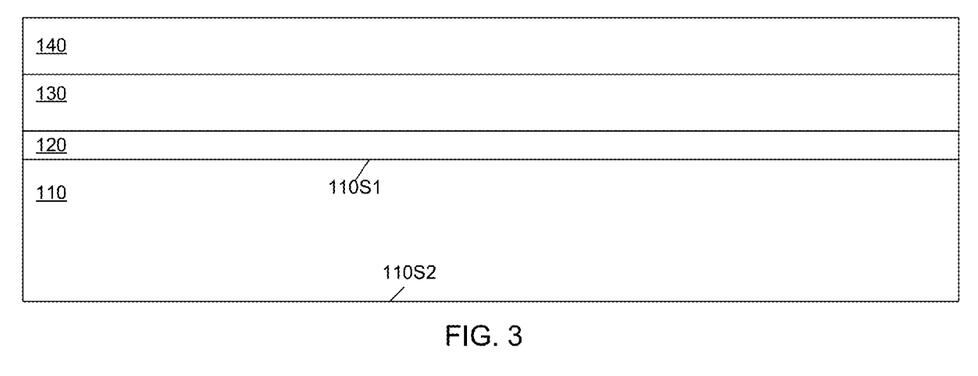

Referring to FIG. 3, a layer 130 may then be formed over the layer 120. The layer 130 may be a conductive layer. The layer 130 may be a metallic layer. The layer 130 may comprise a conductive material. The layer 130 may comprise a metallic material. The metallic material may include a pure metal, an alloy and/or a compound. It is understood that any pure metal may include some amount of trace impurities. An alloy may include at least two metallic elements. An alloy may include a metallic element and a non-metallic element (such as steel). The layer 130 may include one or more materials from the group consisting of pure copper, copper alloy, copper compound, pure silver, silver alloy, silver compound, pure gold, gold alloy, and gold compound.

In one or more embodiments, the layer 130 may comprise pure copper and/or copper alloy. In one or more embodiments, the layer 130 may include the element Cu (copper). In one or more embodiments, the element Cu may be in the form of a pure metal and/or an alloy and/or a compound.

As noted above, the layer 120 may comprise a material which may prevent the material of layer 130 from diffusing into the substrate 110. In one or more embodiments, it is possible that the layer 120 is not used. In one or more embodiments, it is possible that the layer 130 be formed directly onto the substrate 110.

Still referring to FIG. 3, a masking layer 140 may be formed over the layer 130. The masking layer 140 may comprise a resist layer (for example, a photoresist layer).

Figure 4A:
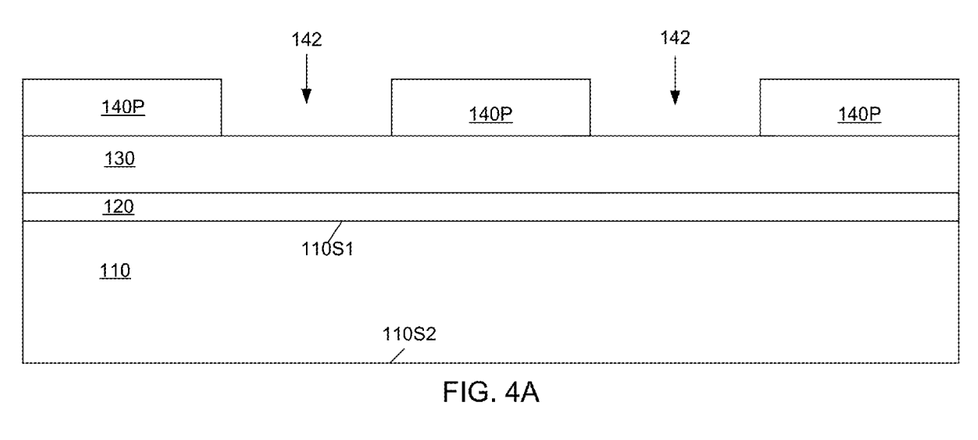

Referring to FIG. 4A, the masking layer 140 may be patterned to form the mask 140P. The mask 140P may include one or more spaced apart portions. Likewise, the mask 140P may include one or more spaced apart portions. One or more openings 142 may be formed through the masking layer 140. The openings 142 may, for example, be trenches or holes. The openings 142 may expose the layer 130.

Figure 4B:
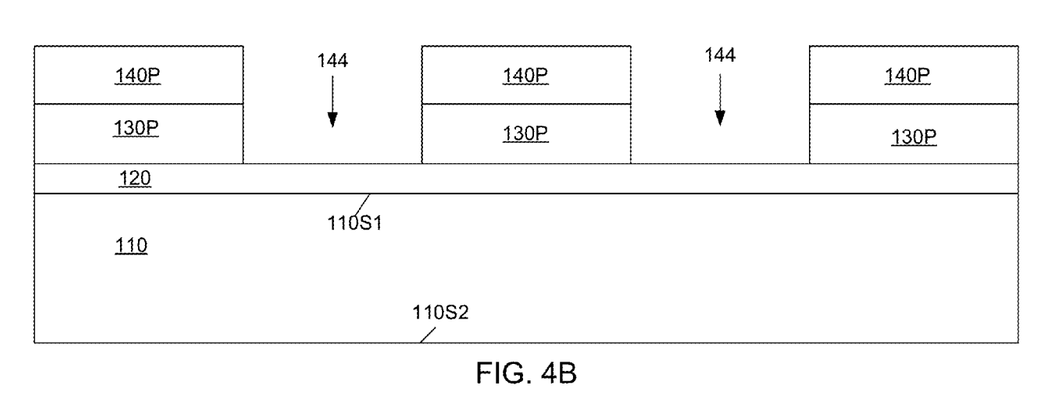

Referring to FIG. 4B, the pattern from the mask 140P may be transferred to the layer 130 to form the patterned layer 130P. One or more openings 144 may be formed through the layer 130. The openings 144 may be trenches or holes. In one or more embodiments, the patterning of layer 130 to form the patterned layer 130P may be accomplished using an etching process. In one or more embodiments, the etching process may include a wet etching process. In one or more embodiments, the etching process may include a dry etching process (for example, a plasma etching process). The patterning of layer 130 to form the layer 130P may expose the layer 120.

Figure 4C:
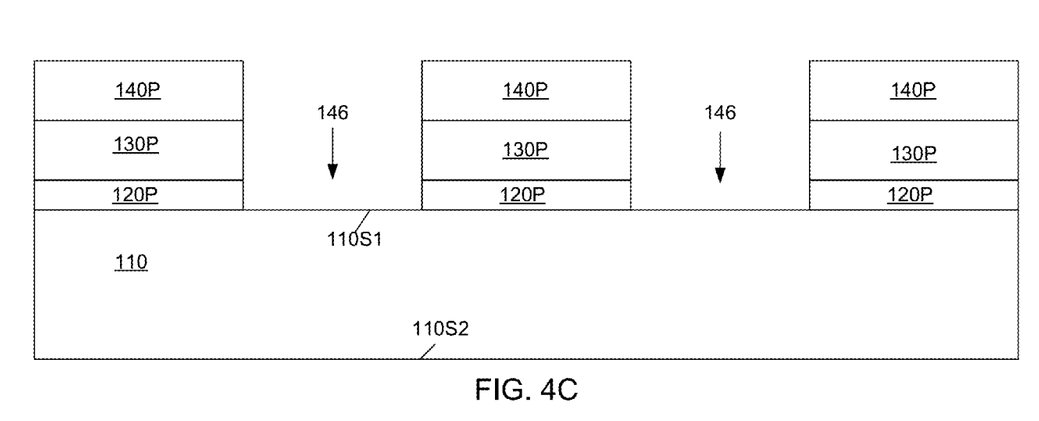

Referring to FIG. 4C, the layer 120 may be patterned to form the patterned layer 120P. The patterning of layer 120 may include at least one etching process. One or more openings 146 may be formed through the layer 120 to form the patterned layer 120P. The openings 146 may be trenches or holes. In one or more embodiments, the etching process may include a wet etching process. In one or more embodiments, the etching process may include a dry etching process (for example, a plasma etching process). The patterning of layer 120 to form the layer 120P may expose the substrate 110 (for example, the first side 110S1 of the substrate 110).

Figure 4D:
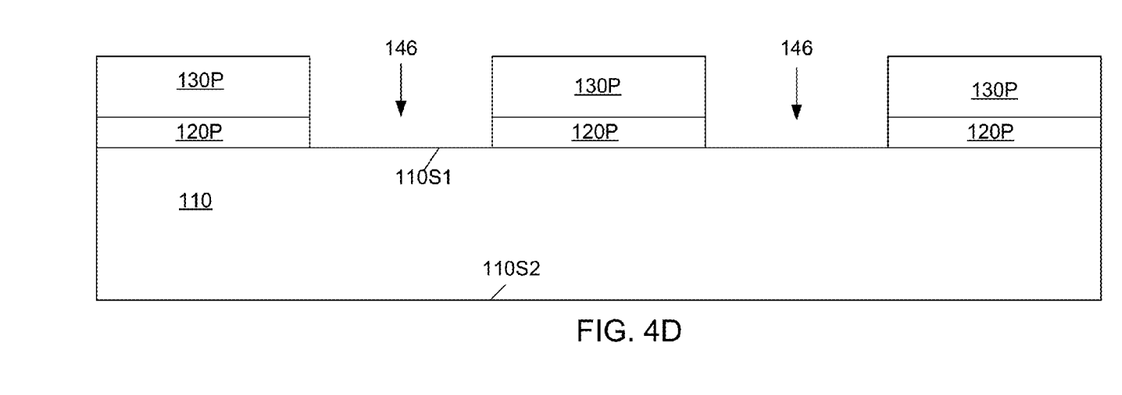

Referring to FIG. 4D, the mask 140P may be removed.

Figure 5:
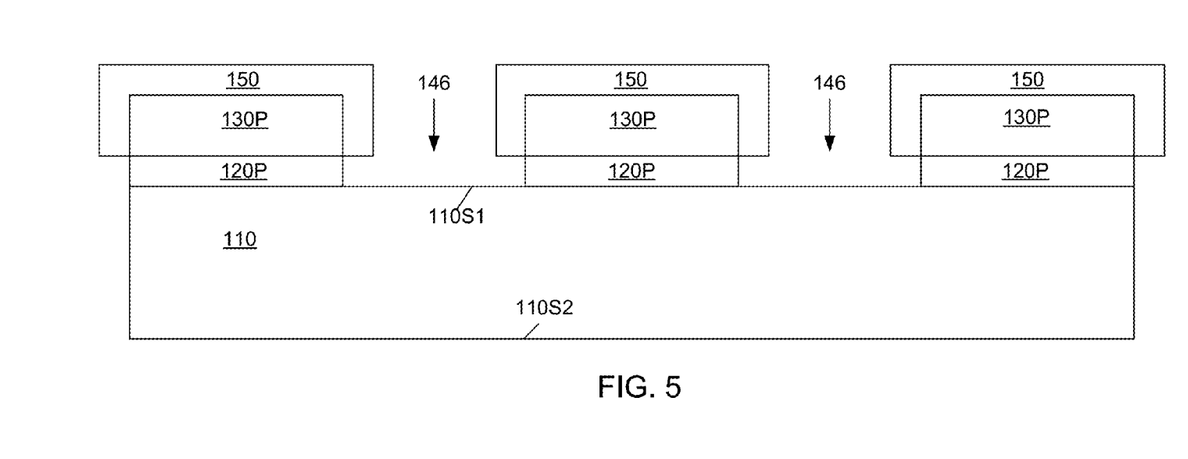

Referring to FIG. 5, a layer 150 may then be formed over the surfaces of the patterned layer 130P. In an embodiment, a layer 150 may be formed directly on the exposed surfaces of the layer 130P. In one or more embodiments, the layer 150 may coat the exposed surfaces of the layer 130P. In one or more embodiments, the layer 150 may cover the exposed surfaces of the layer 130P. In one or more embodiments, the exposed surfaces of the patterned layer 130P (prior to the deposition of layer 150) may be sidewall and top surfaces of the patterned layer 130P. The formation of layer 150 may be done by a deposition process or by a growth process. In one or more embodiments, this may be done by a deposition process. In one or more embodiments, the deposition process may, for example, include an electro-less deposition process. In one or more embodiments, the deposition process may include an electrodeposition process (e.g. an electroplating process). The layer 150 may comprise a metallic material. The metallic material may include a pure metal, an alloy and/or a compound. In one or more embodiments, examples of materials which may be used include transition metal elements. In one or more embodiments, the layer 150 may include the element Ni (nickel). The element Ni may be in any form such as pure nickel, nickel alloy and/or nickel compound. Examples of materials include pure nickel, nickel alloys and nickel compounds. In one or more embodiments, the layer 150 may include a material which would not contaminate. For example, in one or more embodiments, the layer 150 may include a material which does not react with (e.g. chemically react with) the substrate 110. In one or more embodiments, it is possible that the layer 150 comprise a transition metal element. In one or more embodiments, it is possible that the layer 150 comprise an element from group VIII of the Periodic Table of Elements. In one or more embodiments, it is possible that the layer 150 comprise one or more elements from the group consisting of Fe, Co, Ni, Ru, Rh, Pd, Os, Ir, and Pt.

In one or more embodiments, the layer 130 (and the layer 130P) may comprise a first metallic material. In one or more embodiments, the layer 150 may comprise a second metallic material which is different (for example, a different composition) from the first metallic material.

In one or more embodiments, the layer 130 (and the layer 130P) may consist essentially of a first metallic material. In one or more embodiments, the layer 150 may consist essentially of a second metallic material which is different (for example, a different composition) from the first metallic material.

In one or more embodiments, the layer 150 may comprise a metallic material which lacks pure copper. In one or more embodiments, the layer 150 may comprise a metallic material which lack a copper alloy. In one or more embodiments, the layer 150 may comprise a metallic material which lacks pure copper and a copper alloy. In one or more embodiments, the layer 150 may comprise a metallic material which lacks the element Cu. In one or more embodiments, the metallic material that lacks pure copper and/or copper alloy may be a pure metal and/or an alloy.

Figure 6A:
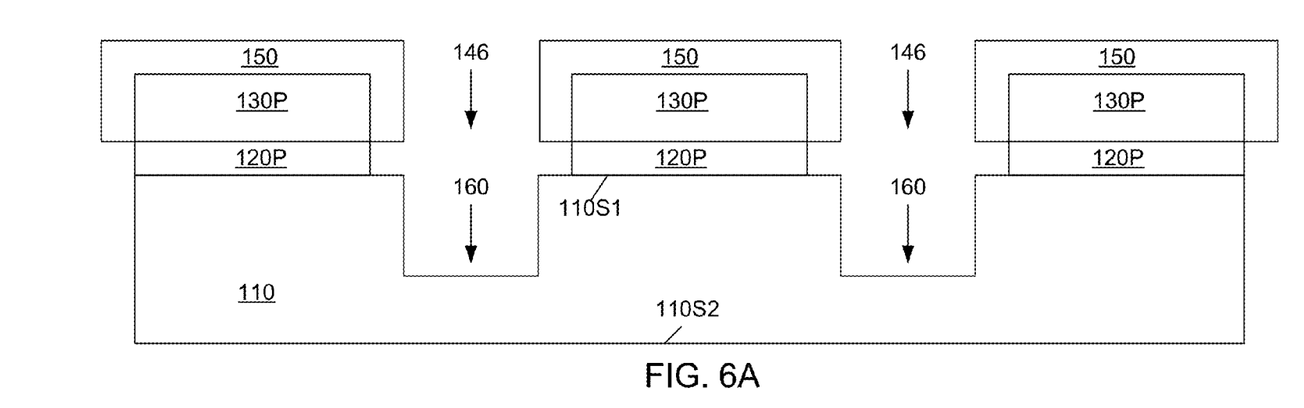

Referring to FIG. 6A, a mask may be formed that includes the layer 130P and layer 150. Hence, the layers 130P, 150 may be used as a mask for etching the substrate 110 (for example, for etching the first side S1 of the substrate 110). In one or more embodiments, the etching process used may include a plasma etching process. In one or more embodiments, the plasma etching process may include a Reactive Ion Etching (RIE) process. In one or more embodiments, the RIE process may include a Deep Reactive Ion Etching (DRIE) process. In one or more embodiments, the etching process may include a Bosch etching process. In one or more embodiments, the etching process may include a dry etching process.

The etching process may be used to etch openings 160 within the substrate 110. In one or more embodiments, one or more of the openings 160 may be trenches. In one or more embodiments, one or more of the openings 160 may be holes. In one or more embodiments, the openings 160 may go only partially through the substrate 110.

Figure 6B:
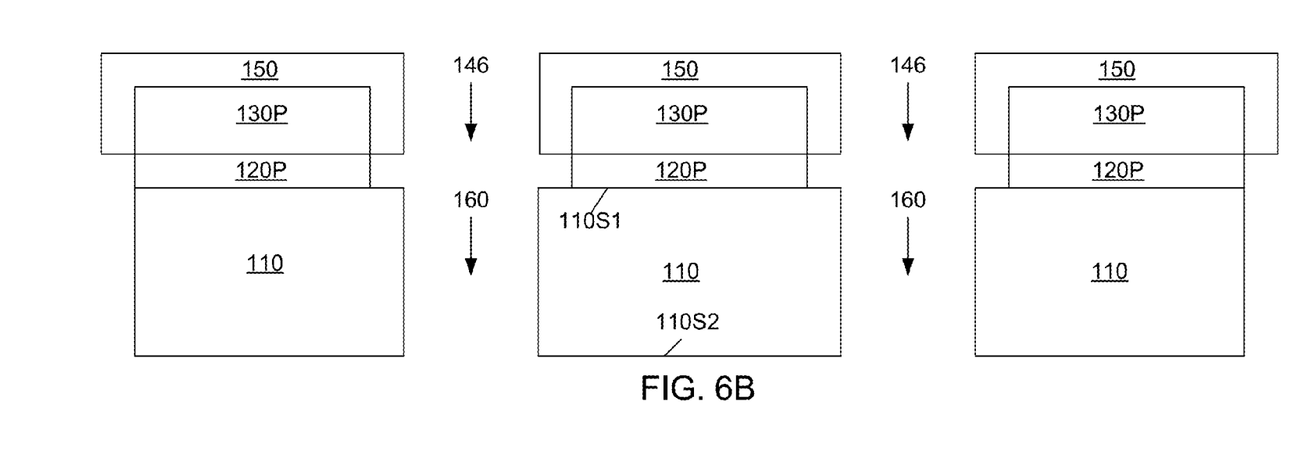
FIG. 6B shows a semiconductor structure in accordance with an embodiment.

Referring to FIG. 6B, it is seen that in one or more embodiments, the openings 160 may be formed fully through the substrate 110. Hence, the openings 160 may be formed at least partially through the substrate 110.

In one or more embodiments, the openings 160 may be in a kerf region of a semiconductor substrate. For example, in one or more embodiments, the openings 160 may be in a kerf region of semiconductor wafer substrate.

In one or more embodiments, the material used for the layer 150 may be one which would not contaminate (for example, react with) the substrate 110. For example, in one or more embodiments, the material used for the layer 150 would not react with (for example, chemically react with) the material of the substrate 110. Hence, during a plasma etching process, some of the atoms of the layer 150 may be knocked off and may land on the surface of the substrate 110 or penetrate the bulk of the substrate 110. Since the material of layer 150 may be chosen so as not contaminate (for example, react with) the substrate 110 then this may not cause a problem. It is seen that without the layer 150, it is possible that atoms of the patterned layer 130P may instead be knocked onto or into the substrate 110. The layer 150 may thus protect the patterned layer 130P during a plasma etch or some other type of etch.

The layers 120P, 130P, 150 may remain over the substrate 110 (for example, over the first surface 110S1 of the substrate 110) after the etching process is complete or they may be removed.

In one or more embodiments, the layer 120 may not be used. In one or more embodiments, the layer 130 may be formed directly on the substrate 110. In one or more embodiments, some other layer may be used instead of layer 120. In one or more embodiments, additional layers may be used.

Referring once again to FIGS. 4A-D as well as to FIG. 5, it is possible that, yet another embodiment is also possible. For example, in another embodiment, it is possible that the layer 150 is formed after the layer 130 is patterned to form the patterned layer 130P but before the layer 120 is patterned to form the layer 120P. The layer 120 may be patterned after the layer 150 is formed. It is then possible that the substrate 110 is etched as described above.

It is seen that the teachings described herein may be used to etch a semiconductor substrate for any purpose. The etching process may be used to form openings (such as trenches or holes) in a semiconductor substrate. As noted the semiconductor substrate may be a silicon substrate such as a monocrystalline silicon substrate. It is understood that a semiconductor substrate may be any semiconductor workpiece or semiconductor layer. The semiconductor material may be doped or undoped. It is understood that a silicon substrate may be any silicon workpiece or silicon layer. The silicon may be doped or undoped. In one or more embodiments, the silicon may be monocrystalline silicon such a bulk monocrystalline silicon. In one or more embodiments, the silicon may be a doped silicon. In one or more embodiments, the silicon may be an undoped silicon. In one or more embodiments, the silicon may be polysilicon. In one or more embodiments, the semiconductor substrate may include the element Si in any form. In one or more embodiments, the In one or more embodiments, the semiconductor substrate may include SiC. In one or more embodiments, substrate may include the material GaAs. In one or more embodiments, the substrate may include GaN. In one or more embodiments, the substrate may include a wafer substrate or may be a wafer substrate.

Figure 7:
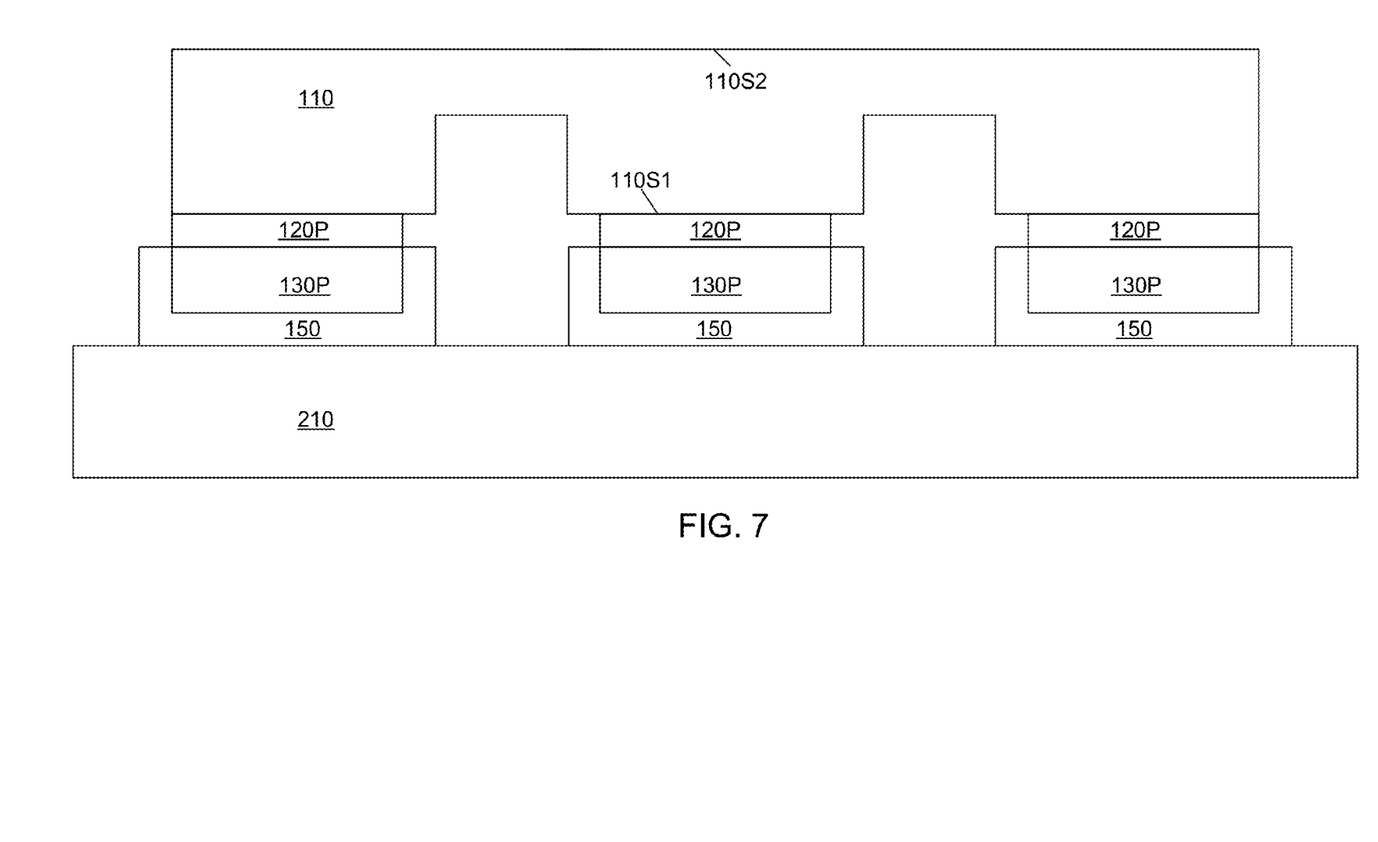
FIGS. 7 through 9 show a method of making a semiconductor structure in accordance with an embodiment.
Figure 8:
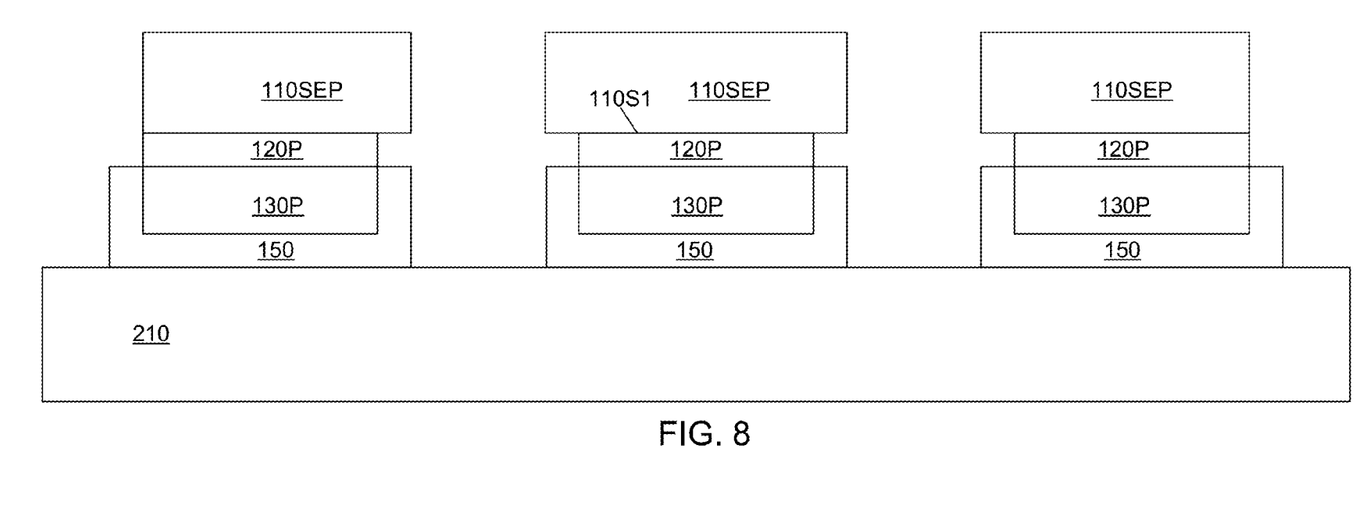

Referring to FIG. 7, in one or more embodiments, it is possible that the structure shown in FIG. 6A may be attached to a carrier 210 as shown in FIG. 7. The carrier 210 may be a carrier substrate or a carrier wafer. The substrate 110 may, for example, be turned upside down an affixed to a carrier 210. Referring to FIG. 8, it is possible that the material of the substrate 110 is removed from the second side S2 of the substrate 110. This removal may be performed by a mechanical process such as mechanical grinding or chemical mechanical polishing. In one or more embodiments, it may be possible that the removal is performed by some type of etching process. In one or more embodiments, it may be possible that the removal is performed by chemical means.

Referring to FIG. 8, in one or more embodiments, it may be possible that the substrate 110 may be separated into a plurality of individual pieces 110SEP as a result of the substrate removal (for example, grinding) from the second side S2.

Figure 9:
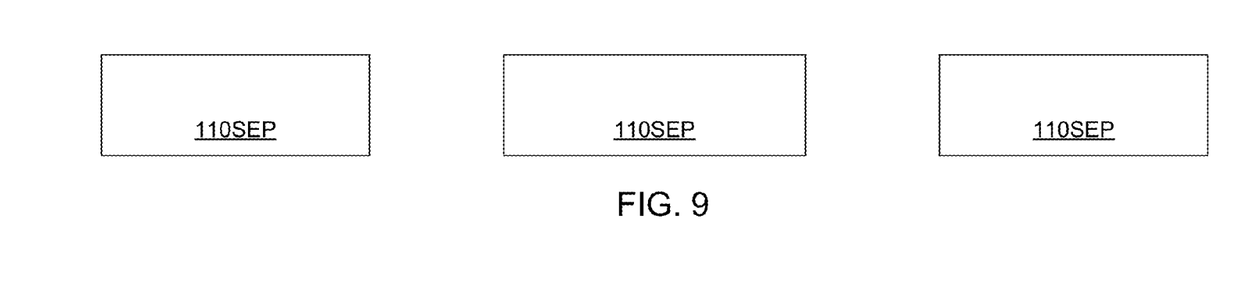

FIG. 9, shows the embodiment in which the substrate 110 has been separated into individual pieces 110SEP. In one or more embodiments, the substrate 110 may represent a wafer substrate. In one or more embodiments, the individual pieces may represent chip substrates.

It is understood that the etching process shown in FIG. 6A to form the one or more openings 160 may, in one or more embodiments, be performed where the first side 110S1 represents a front side and the second side 110S2 represent a back side. Likewise, in one or more embodiments, the etching process to form openings 160 may be performed where the first side 110S1 represents a back side and the second side 110S2 represents a front side.

It is understood that the etching process shown in FIG. 6A to form the one or more openings 160 may, in one or more embodiments, be performed where the first side 110S1 represents a device side. Likewise, in one or more embodiments, the etching process to form openings 160 may be performed where the second side 110S2 represents a device side.

It is noted that, one or more additional layers may be formed over the second side 110S2 of the substrate 110 prior to the formation of the openings 160 in the substrate 110. The at least one additional layer may includes one or more devices and/or one or more metallization layers and/or one or more interlevel dielectric layers which may be formed over the second side 110S2 of the substrate 110 prior to the formation of the openings 160. In an embodiment, an additional layer may be formed over the second side 110S2 before the formation of one or more of the layers 120, 130, 150. Likewise, in an embodiment, an addition layer may be formed after the formation of opening 140 or after the formation of opening 160.

Figure 10:
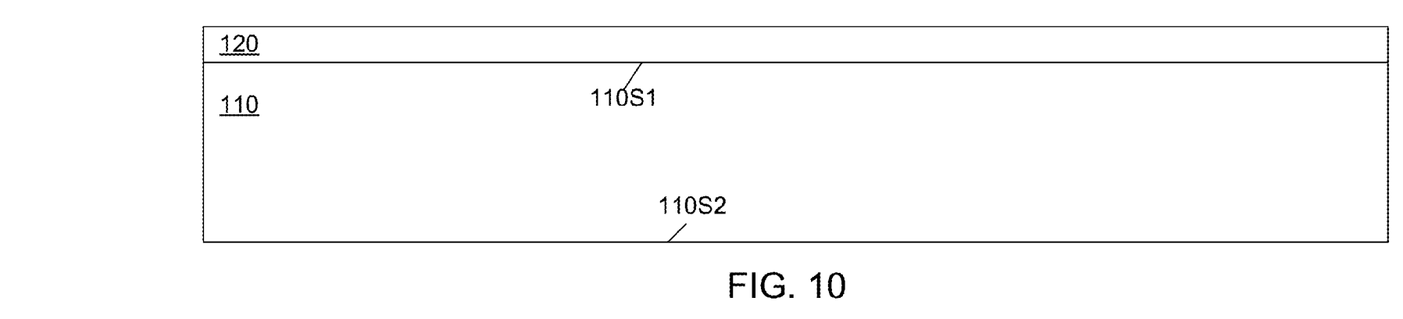

FIGS. 10 through 18A show a process for making a semiconductor structure in accordance with an embodiment. Referring to FIG. 10, FIG. 10 shows the same structure as FIG. 2. Referring to FIG. 10, a barrier layer 120 is formed over the substrate 110. The barrier layer 120 as well as the substrate 110 have been described above and the discussion applies here as well. The barrier layer 120 may, for example, be a conductive layer, such as a metallic layer. The barrier layer 120 may, for example, comprise the same materials as the materials described above for the barrier layer 120 described above. The barrier layer 120 may, for example, comprise a conductive compound such as a metallic compound. Examples of possible barrier layer materials include TiN, TaN, WN and TiW.

Figure 11:
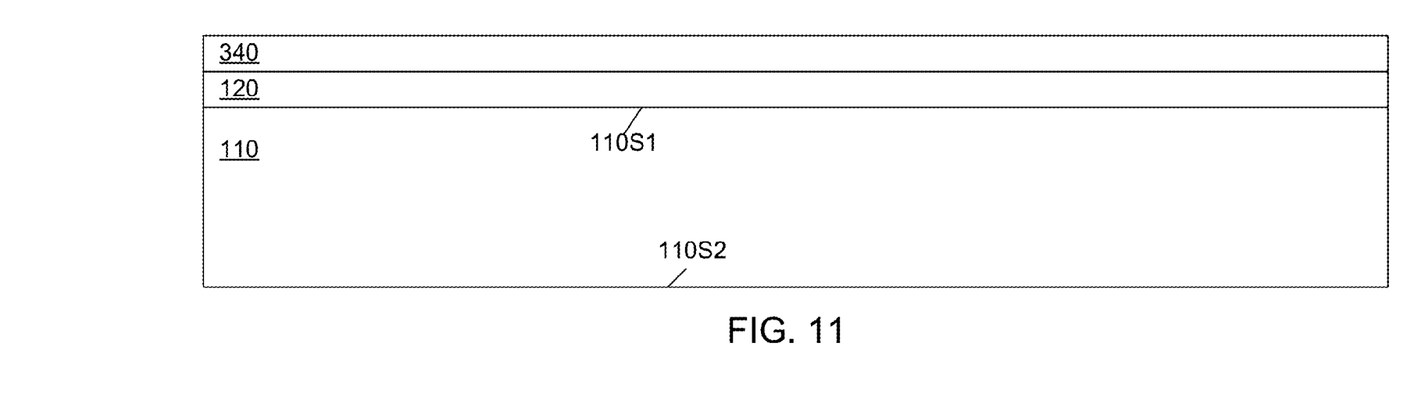

Referring to FIG. 11, a seed layer 340 may be formed over the barrier layer 120. In one or more embodiments, the seed layer 340 may comprise a conductive material. In one or more embodiments, the seed layer 340 may comprise a metallic material. As examples, the seed layer 340 may comprise a pure metal, an alloy and/or a compound. As noted, any pure metal may include some amount of trace impurities. In one or more embodiments, the seed layer 340 may include a pure metal, an alloy and/or a compound. As noted above, any pure metal may include some amount of trace impurities. In or more embodiments, the seed layer 340 may include one or more of the elements Cu (copper), Ag (silver), Au (gold) and W (tungsten). In one or more embodiments, the fill layer 360 may include the element Cu (copper). The Cu (copper) may be in any form such as a pure metal, an alloy and/or a compound. In one or more embodiments, the seed layer 340 may include one or more materials selected from the group consisting of pure copper, copper alloy, pure silver, silver alloy, pure gold, gold alloy, pure tungsten, and tungsten alloy. In one or more embodiments, the seed layer 340 may include pure copper and/or copper alloy. In one or more embodiments, the seed layer 340 may be formed by a physical vapor deposition process.

Figure 12:
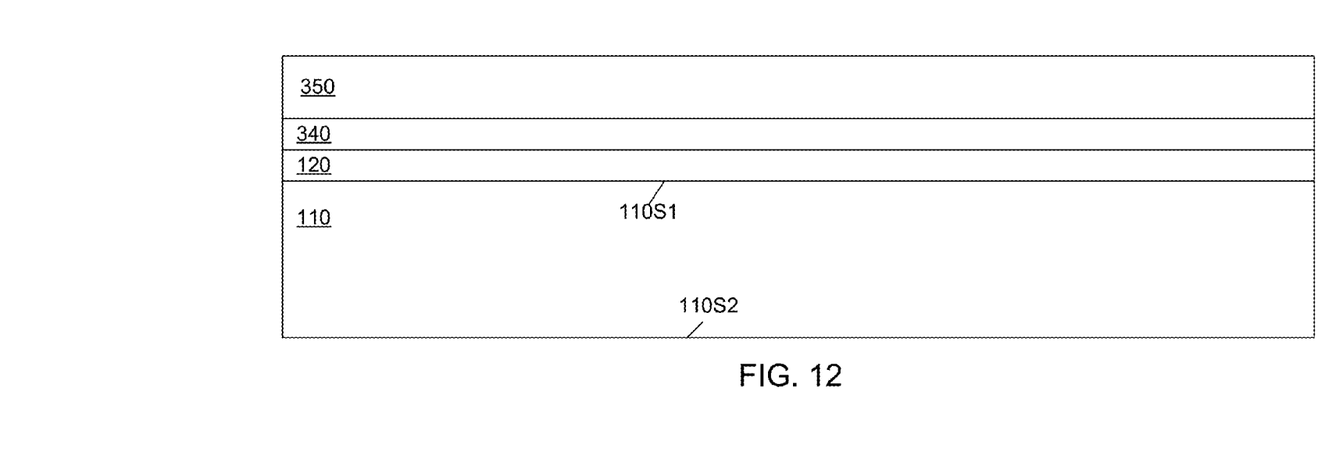

Referring to FIG. 12, a masking layer 350 may be formed over the seed layer 340. The masking layer 350 may be a resist layer (e.g. a photoresist layer).

Figure 13:
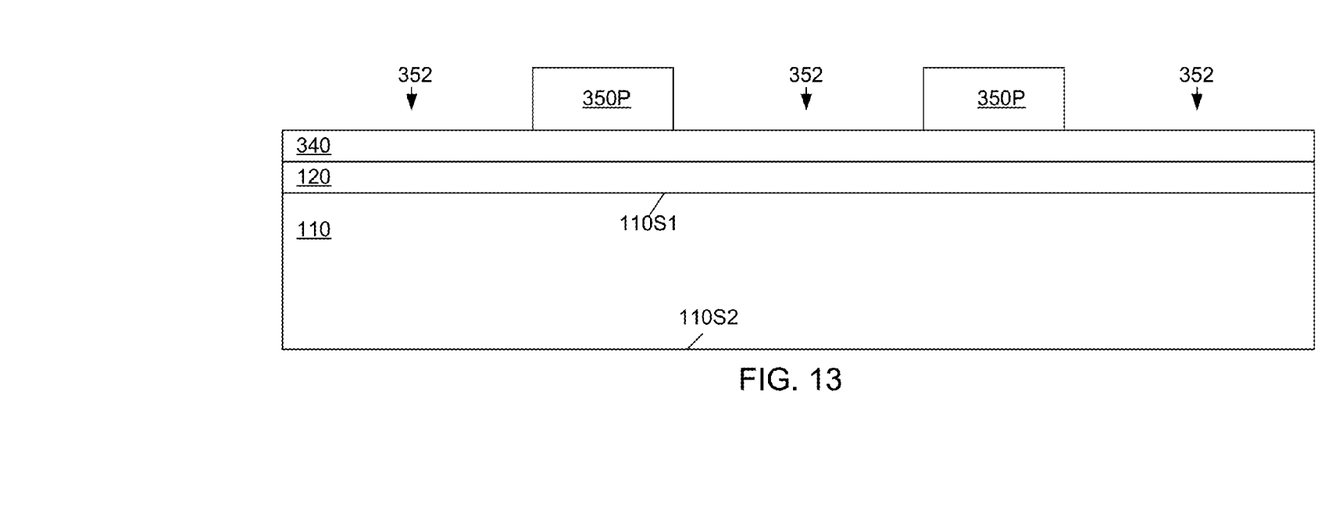

Referring to FIG. 13, the masking layer 350 may be patterned to form the patterned masking layer 350P. The patterned masking layer 350P may include one or more openings 352. The patterned masking layer 350P may also be referred to as a mask.

Figure 14:
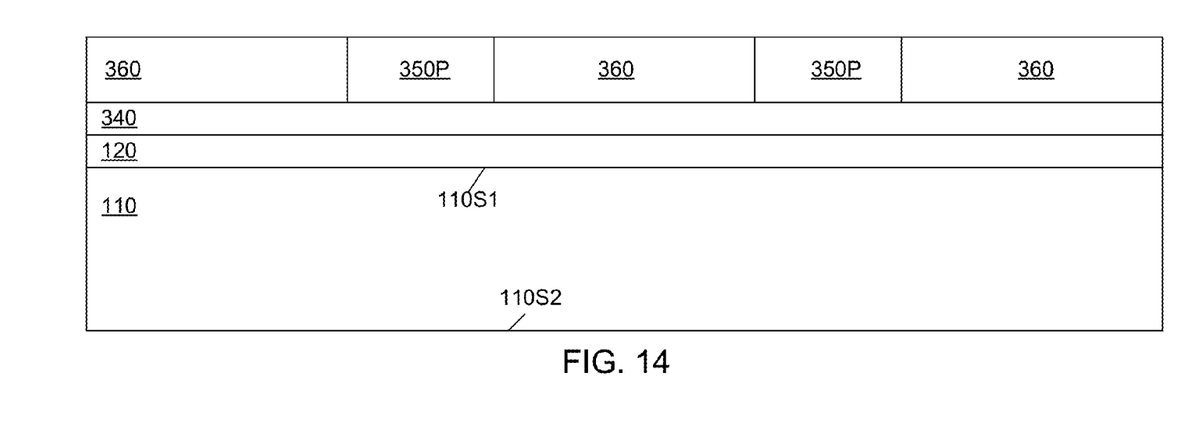

Referring to FIG. 14, a fill layer 360 may then formed within the openings 352 of the patterned masking layer 350P. The fill layer 360 may be formed by a deposition process. The deposition process may comprise an electrodeposition (e.g. electroplating) process. Hence, in one or more embodiments, the fill layer may include any material which may be electrodeposited. In one or more embodiments, the fill layer 360 may include a conductive material. In one or more embodiments, the fill layer 360 may include a metallic material. In one or more embodiments, the fill layer 360 may include a pure metal, an alloy and/or a compound. As noted above, any pure metal may include some amount of trace impurities. In or more embodiments, the fill layer 360 may include one or more of the elements Cu (copper), Ag (silver), Au (gold) and W (tungsten). In one or more embodiments, the fill layer 360 may include the element Cu (copper). The Cu (copper) may be in any form such as a pure metal, an alloy and/or a compound. In one or more embodiments, the fill layer may include one or more materials selected from the group consisting of pure copper, copper alloy, pure silver, silver alloy, pure gold, gold alloy, pure tungsten, and tungsten alloy. In one or more embodiments, the fill layer 360 may include pure copper and/or copper alloy. It is noted that, in one or more embodiments, the layer 360 may include two or more spaced apart portions. It is again understood that a pure metal may include trace impurities.

Figure 15:
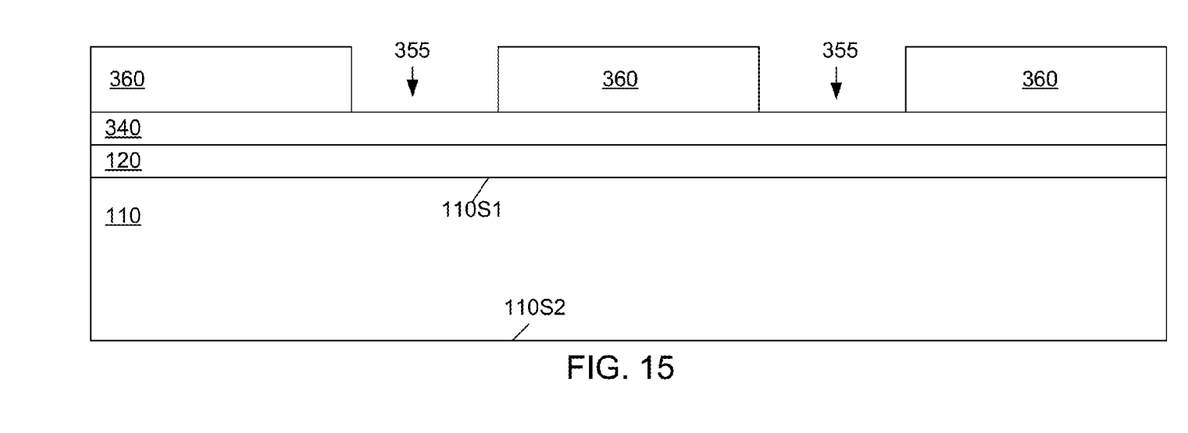

Referring to FIG. 15, the patterned masking layer 350P may be removed. The removal may include an etching process. The etching process may include a wet etching process and/or a dry etching process. The removal results in the formation of openings 355. The openings 355 may, for example, be trenches or holes.

The fill layer 360 may be a patterned layer. Hence, in one or more embodiments, a patterned layer may be formed by a process that includes an electrodeposition (or electroplating) process. In one or more embodiments, the fill layer 360 may be a patterned metallic layer.

Figure 16:
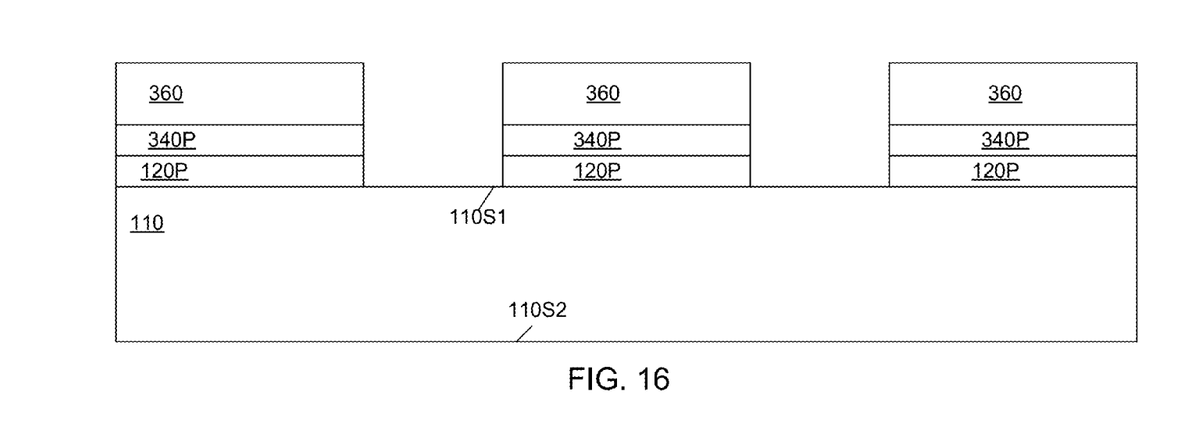

Referring to FIG. 16, the portion of the seed layer 340 which is exposed may then be removed. The exposed portion may underlie the openings 355. The removal of a portion of the seed layer 340 may include an etching process. The etching process may include a wet etching process and/or a dry etching process. The removal of a portion of the seed layer 340 forms a patterned seed layer 340P. The layer 360 and the layer 340P may be viewed as a patterned layer 360,340P. In one or more embodiments, the patterned layer 360,340P may be a patterned metallic layer 360,340P.

Likewise, a portion of the barrier layer 120 that underlies the openings 355 may also be removed. The removal of the barrier layers may include at least one etching process. The etching process may include a wet etching process and/or a dry etching process. The removal of a portion of the barrier layer 120 forms a pattered barrier layer 120P The removals of the barrier layer portion may expose the substrate 110. The removal of the seed layer portion and the barrier layer portion results in the formation of the patterned barrier layer 120P and the patterned seed layer 340P. As noted the portion of the seed layer 340 and the portion of the barrier layer underlying the openings 355 may be removed. The removal may be accomplished by at least one etching process. The etching process may include a wet etching process and/or a dry etching process.

Figure 17:
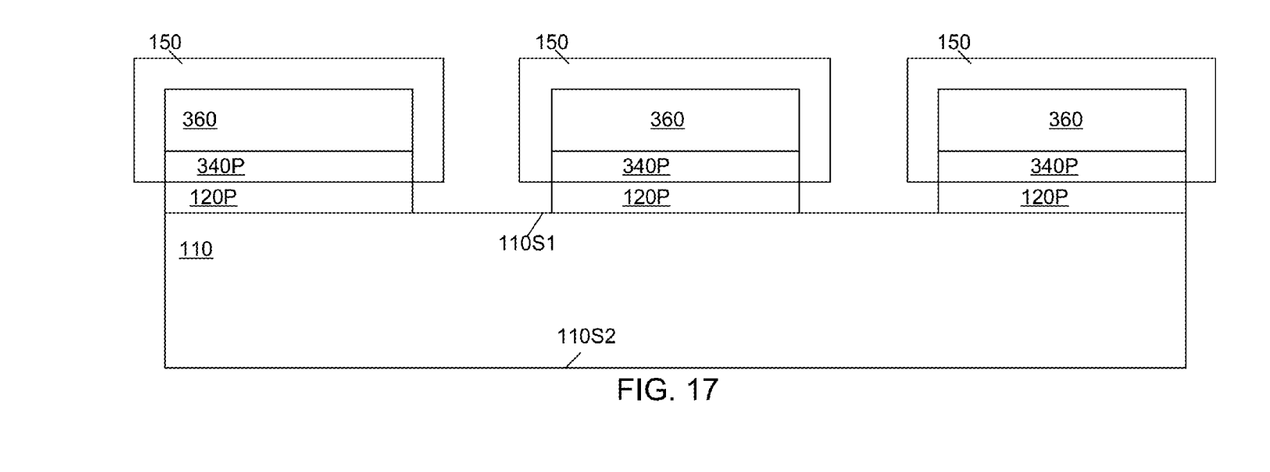

Referring to FIG. 17, a layer 150 may then be formed over the exposed surfaces of the layer 360 as well as the exposed surfaces of the layer 340P. In an embodiment, a layer 150 may be formed directly on the exposed surfaces of the layer 360 as well as the exposed surfaces of the layer 340P. In one or more embodiments, the layer 150 may coat the exposed surfaces of the layer 360 as well as the exposed surfaces of the layer 340P. In one or more embodiments, the layer 150 may cover the exposed surfaces of the layer 360 as well as the exposed surfaces of the layer 340P. The exposed surfaces of layer 360 may be sidewall and top surfaces of the layer. The exposed surfaces of the layer 340P may be sidewall surfaces of the layer 340P. The formation of layer 150 may include a deposition process or by a growth process. In one or more embodiments, formation of layer may include a deposition process. The deposition process may, for example, include an electroless deposition process. In one or more embodiments, the deposition process may include an electrodeposition process. The layer 150 may comprise a metallic material. The metallic material may include a pure metal, an alloy and/or a compound. Examples of materials which may be used include transition metal elements. The layer 150 may include the element Ni (nickel). The element Ni may be in any form such as pure nickel, nickel alloy and/or nickel compound. The layer 150 may include pure nickel and/or nickel alloy and/or nickel compound. The layer 150 may include a material which would not contaminate (for example, not react with) the substrate 110. As an example, the layer 150 may include a material which would not react (for example, chemically react) with the material of the substrate. In one or more embodiments, it is possible that the layer 150 comprise a transition metal element. In one or more embodiments, it is possible that the layer 150 comprise an element from group VIII of the Periodic Table of Elements. In one or more embodiments, it is possible that the layer 150 comprise one or more elements from the group consisting of Fe, Co, Ni, Ru, Rh, Pd, Os, Ir, and Pt. It is understood that any pure metal may include trace impurities.

In one or more embodiments, the layer 360 may comprise a first metallic material. In one or more embodiments, the layer 150 may comprise a second metallic material different from (for example, a different composition from) the first metallic material.

In one or more embodiments, the layer 150 may comprise a metallic material which lacks pure copper. In one or more embodiments, the layer 150 may comprise a metallic material which lack a copper alloy. In one or more embodiments, the layer 150 may comprise a metallic material which lacks pure copper and a copper alloy. In one or more embodiments, the layer 150 may comprise a metallic material which lacks the element Cu. In one or more embodiments, the metallic material that lacks pure copper and/or copper alloy may be a pure metal and/or an alloy.

Figure 18A:
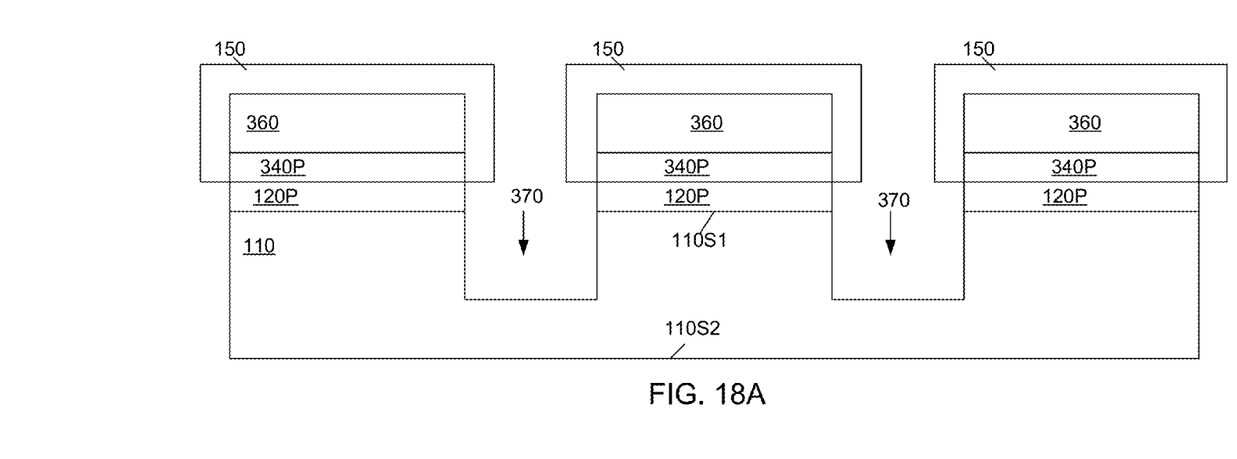
Figure 18B:
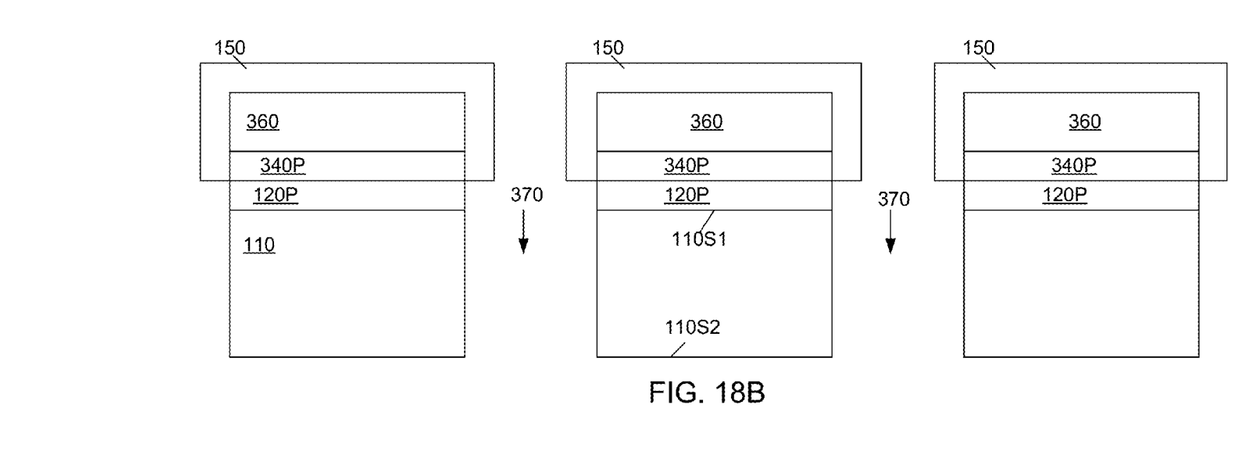
FIG. 18B shows a semiconductor structure in accordance with an embodiment.

Referring to FIG. 18A, a mask may be formed. In one or more embodiments, the mask may comprise the layers 150 and 360. In one or more embodiments, the mask may comprise the layers 150, 360 and 340P. The mask (for example, the layers 150, 360 or, for example, the layers 150, 360 and 340P) may be used as a mask for etching the substrate 110. The mask may be used as a mask for etching the substrate 110 (for example, for etching the first side S1 of the substrate 110). The etching process used may include a plasma etching process. In one or more embodiments, the plasma etching process may include a Reactive Ion Etching (RIE) process. The Reactive Ion Etching process may include a Deep Reactive Ion Etching process. The etching process may include a Bosch etching process. In one or more embodiments, the etching process may include a dry etching process. The etching process may be used to etch the substrate 110. The etching process may be used to etch openings 370 within the substrate 110. In one or more embodiments, one or more of the openings 370 may be trenches. In one or more embodiments, one or more of the openings 370 may be holes. In one or more embodiments, the openings 370 may go only partially through the substrate 110. Referring, for example, to FIG. 18B, in one or more embodiments, the openings 370 may instead go fully through the substrate. Hence, the openings 370 may be formed at least partially through the substrate 110.

In one or more embodiments, the openings 370 may be in a kerf region of a semiconductor substrate. For example, in one or more embodiments, the openings 370 may be in a kerf region of semiconductor wafer substrate.

It is noted that, in another embodiment, the layer 120 may not be used. In one or more embodiments, the material used for the layer 150 may be one which would not contaminate (for example, react with) the substrate 110. For example, in one or more embodiments, the material used for the layer 150 would not react with (for example, chemically react with) the material of the substrate 110. Hence, during the plasma etching process, some of the atoms of the layer 150 may be knocked off and may land on the surface of the substrate 110 or penetrate the bulk of the substrate 110. Since the material of layer 150 may be chosen so as not contaminate (for example, react with) the substrate 110 then this may not cause a problem. It is seen that without the layer 150, it is possible that atoms of the layer 360 may instead be knocked onto or into the substrate 110. The layer 150 may thus protect the layer 360 during a plasma etch or some other type of etch.

Further process steps may be formed in order to remove a portion of the substrate 110 from the second side S2. for example, the substrate 110 may be ground from the second side S2. The grinding process (or some other removal process) may be used to creates a plurality of individual portions of the substrate 110.

As noted above, the first side 110S1 of the substrate 110 may, in one embodiment, be a front side and, in another embodiment, the front side 110S1 may be a back side. As noted above, the first side 110S1 of the substrate 110 may, in one embodiment, be a device side and, in another embodiment, the second side 110S2 may be a device side.

It is noted that, one or more additional layers may be formed over the second side 110S2 of the substrate 110 prior to the formation of the openings 370. The at least one additional layer (e.g. one or more devices, one or more metallization layers and/or one or more interlevel dielectric layers) may be formed over the second side 110S2 of the substrate 110 prior to the formation of the openings 370. In an embodiment, an additional layer may be formed over the second side 110S2 before the formation of one or more of the layers 120, 340, 360. Likewise, in an embodiment, an addition layer may be formed after the formation of opening 355 or after the formation of opening 370.

One or more embodiments relate to a method of making a semiconductor structure, comprising: forming a patterned metallic layer over a semiconductor substrate; coating the patterned metallic layer with a coating layer; and etching the semiconductor substrate.

One or more embodiments relate to a method of making a semiconductor structure, comprising: forming a patterned metallic layer over a semiconductor substrate; forming a second layer over the patterned metallic layer; and etching the substrate.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of making a semiconductor structure, comprising:
   forming a patterned metallic layer over a semiconductor substrate;
   after forming the patterned metallic layer, coating said patterned metallic layer with a coating layer;
   etching said semiconductor substrate; and
   separating said substrate into a plurality of individual pieces.

2. The method of claim 1, further including forming a barrier layer over said substrate before forming said patterned metallic layer, said patterned metallic layer being formed over said barrier layer.

3. The method of claim 1, wherein said coating layer comprises a metallic material.

4. The method of claim 1, wherein coating layer comprises a transition metal element.

5. The method of claim 1, wherein said coating layer comprises Ni (nickel).

6. The method of claim 5, wherein said Ni (nickel) is in the form of pure nickel and/or nickel alloy and/or nickel compound.

7. The method of claim 1, wherein said coating layer comprises pure nickel and/or nickel alloy.

8. The method of claim 1, wherein said metallic layer comprises pure copper and/or copper alloy.

9. The method of claim 1, wherein said metallic layer comprises a first metallic material and said coating layer comprises a second metallic material different from said first metallic material.

10. The method of claim 1, wherein said semiconductor substrate is a silicon substrate.

11. The method of claim 10, wherein said silicon substrate comprises monocrystalline silicon.

12. The method of claim 2, wherein said barrier layer includes one or more elements from the group consisting of Ti, Ta, N, and W.

13. The method of claim 1, wherein said coating layer is formed directly on said patterned metallic layer.

14. The method of claim 1, wherein said coating said patterned metal layer comprises an electro-less deposition process.

15. The method of claim 1, wherein said patterned metallic layer is formed over a first side of said substrate and said etching is etching said first side.

16. The method of claim 15, wherein said first side is a front side of said substrate.

17. The method of claim 15, wherein said first side is a back side of said substrate.

18. The method of claim 1, wherein said etching includes plasma etching.

19. The method of claim 1, wherein said forming said patterned metallic layer comprises forming a metallic layer over said substrate, and patterning said metallic layer.

20. The method of claim 1, wherein said etching said substrate forms an opening only partially through said substrate.

21. A method of making a semiconductor structure, comprising:
   forming a patterned metallic layer over a semiconductor substrate;
   after forming the patterned metallic layer, forming a second layer over said patterned metallic layer;
   etching said substrate; and
   separating said substrate into a plurality of individual pieces.

22. The method of claim 21, further including forming a barrier layer over said substrate before forming said patterned metallic layer, said patterned metallic layer being formed over said barrier layer.

23. The method of claim 21, wherein said second layer includes a metallic material.

24. The method of claim 1, wherein said coating layer comprises a transition metal element.

25. The method of claim 21, wherein said second layer comprises Ni (nickel).

26. The method of claim 25, wherein said Ni (nickel) is in the form of pure nickel and/or nickel alloy and/or nickel compound.

27. The method of claim 21, wherein said second layer includes pure nickel.

28. The method of claim 21, wherein said metallic layer comprises pure copper and/or copper alloy.

29. The method of claim 21, wherein said semiconductor substrate is a silicon substrate.

30. The method of claim 29, wherein said silicon substrate comprises monocrystalline silicon.

31. The method of claim 22, wherein said barrier layer includes one or more elements from the group consisting of Ti, Ta, N, and W.

32. The method of claim 21, wherein said second layer is formed directly on said patterned metallic layer.

33. The method of claim 21, wherein said forming said second layer includes electro-less deposition of said second layer.

34. The method of claim 21, wherein said patterned metallic layer is formed over a front side of said substrate and said etching is etching said front side.

35. The method of claim 21, wherein said patterned metallic layer is formed over a back side of said substrate and said etching is etching said back side.

36. The method of claim 21, wherein said etching include plasma etching.

37. The method of claim 21, wherein said forming said patterned metallic layer comprises forming a metallic layer and patterning said metallic layer.

38. The method of claim 21, wherein said forming said patterned metallic layer comprises an electrodeposition process.

39. The method of claim 21, wherein said substrate is a wafer substrate.

40. The method of claim 21, wherein said substrate is a wafer substrate.

41. A method of making a semiconductor structure, comprising:
    forming a patterned metallic layer over a semiconductor substrate;
    after forming the patterned metallic layer, covering exposed sidewalls of said patterned metallic layer with a coating layer;
    etching said semiconductor substrate; and
    separating said substrate into a plurality of individual pieces.

* * * * *